(12) United States Patent
Melville et al.

(10) Patent No.: US 10,276,461 B2
(45) Date of Patent: Apr. 30, 2019

(54) SPLIT PROBE PAD STRUCTURE AND METHOD

(71) Applicant: GLOBALFOUNDRIES Inc., Grand Cayman (KY)

(72) Inventors: Ian D. W. Melville, Highland, NY (US); Mukta G. Farooq, Hopewell Junction, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/665,974

(22) Filed: Aug. 1, 2017

(65) Prior Publication Data

US 2019/0043769 A1 Feb. 7, 2019

(51) Int. Cl.
| | |
|---|---|
| *H01L 21/66* | (2006.01) |
| *G01R 31/28* | (2006.01) |
| *H01L 23/522* | (2006.01) |
| *H01L 23/528* | (2006.01) |
| *H01L 21/768* | (2006.01) |
| *H01L 23/00* | (2006.01) |

(52) U.S. Cl.
CPC .......... *H01L 22/32* (2013.01); *G01R 31/2884* (2013.01); *H01L 23/528* (2013.01); *H01L 23/5226* (2013.01); *H01L 21/76802* (2013.01); *H01L 21/76877* (2013.01); *H01L 24/03* (2013.01); *H01L 24/06* (2013.01); *H01L 2224/06515* (2013.01)

(58) Field of Classification Search
CPC .... H01L 22/32; H01L 23/5226; H01L 23/528
See application file for complete search history.

(56) References Cited

U.S. PATENT DOCUMENTS

| 2001/0002794 A1 | 6/2001 | Draving et al. |
| 2012/0305916 A1* | 12/2012 | Liu .......................... H01L 22/34 |
| | | 257/48 |

* cited by examiner

*Primary Examiner* — Elias Ullah
(74) *Attorney, Agent, or Firm* — Anthony Canale; Hoffman Warnick LLC

(57) ABSTRACT

A structure and method for forming a split probe pad structure for a semiconductor structure. The split probe pad structure may include a first probe pad structure over a substrate, the first probe pad structure including a first probe pad in electrical communication with the substrate; a second probe pad structure over the substrate, the second probe pad structure including a second probe pad in electrical communication with the substrate, wherein the second probe pad structure is laterally separated from the first probe pad structure; and a non-metal region between the first probe pad structure and the second probe pad structure. The split probe pad structure may be formed in a kerf region of the semiconductor structure. The non-metal region may include a dielectric material.

20 Claims, 5 Drawing Sheets

SPLIT PROBE PAD STRUCTURE AND METHOD

BACKGROUND

The present disclosure relates to semiconductor device fabrication, and more specifically, to probe pad structures and methods of forming the probe pad structures, including a split probe pad structure with a non-metal region.

Conventional integrated circuit (IC) (i.e., chip) formation generally occurs on the surface of a semiconductor substrate, e.g., silicon wafer. A substrate may include multiple chips physically separated by a kerf region. Each chip on the substrate generally includes at least one bond pad at the chip's perimeter which provides electrical access to the devices of the chip before and after dicing and packaging. After formation of the chips, and before dicing and packaging, each chip is electrically accessed and tested. The testing may be performed, for example, by accessing the semiconductor devices of the chip through bond pads. Using the bond pads to electrically test the chips may result in damage to bond pads which may render the chips inoperable. Therefore, the kerf region on the substrate may include probe pads electrically connected to respective bond pads for electrical access to the chip during testing.

Turning to the figures, FIG. 1 shows a conventional semiconductor substrate 100 including chips, e.g., chip 102, physically separated from one another by kerf region 104. FIG. 1 also shows chip 102 including at least one bond pad 106, and kerf region 104 including at least one probe pad 108. FIG. 2 shows a cross section of the conventional probe pad 108 and bond pad 106 of FIG. 1. Bond pad 106 may be in electrical communication with semiconductor device structures of chip 102 (see FIG. 1) for providing electrical access to the device structures, for example, a transistor 110. As shown in FIG. 2, probe pad 108, located in kerf region 104, may be electrically connected to bond pad 106 of chip 102 (see FIG. 1) by vias 114, 118 and metal wires 112, 116. Probe pad 108 and bond pad 106 may be connected, for example, through an electrical path 136 (in phantom) starting from probe pad 108 through metal wire 112, vias 114, metal wire 116, vias 118, bridging polysilicon region 120 positioned on shallow trench isolation 122 in substrate 124, vias 126, metal wire 128, vias 130, and metal wire 132 to probe pad 108. Using probe pads 108 to electrically test the chips before dicing and packing may mitigate and/or prevent damage to bond pads 106.

Once the chips have been fabricated and tested, the chips may be separated (i.e., diced) by cutting through the kerf region without damaging the semiconductor devices of the chips. One challenge relative to separating chips on a substrate may include metal debris released by cutting through the kerf region, including the probe pads. As shown in FIG. 2, the chips may be separated by cutting through a scribe lane 134 (in phantom) in kerf region 104, and through probe pad 108 including the structures thereunder. For example, where laser ablation is used to create a groove, cut, or scribe the kerf region to separate the chips, the laser ablation may recast metal debris from metal structures located in the kerf region (e.g., probe pad 108 of FIG. 2, and the structure thereunder). The metal debris may settle on the walls of the chips which may, for example, cause slow grow cracks to form and eventually cause delamination in the chip. The metal debris released during separation of the chips may render the chips inoperable.

SUMMMARY

A first aspect of the disclosure is directed to a semiconductor structure including: a first probe pad structure over a substrate, the first probe pad structure including a first probe pad in electrical communication with the substrate; a second probe pad structure over the substrate, the second probe pad structure including a second probe pad in electrical communication with the substrate, wherein the second probe pad structure is laterally separated from the first probe pad structure; and a non-metal region between the first probe pad structure and the second probe pad structure.

A second aspect of the disclosure is related to a split probe pad structure in a kerf region of a semiconductor structure, the split probe pad structure including: a first probe pad structure over a doped region of a substrate of the semiconductor structure, the first probe pad structure including a first probe pad in electrical communication with the doped region of the substrate; a second probe pad structure over the doped region of the substrate, the second probe pad structure including a second probe pad in electrical communication with the doped region of the substrate, and wherein the second probe pad structure is laterally separated from the first probe pad structure; and a dielectric region positioned between the first probe pad structure and the second probe pad structure.

A third aspect of the disclosure is related to a method of forming a split probe pad structure for a semiconductor structure, the method including: forming an interlayer dielectric (ILD) layer over a substrate, the ILD layer including: forming a dielectric layer over the substrate; forming a first via and a first metal wire in the dielectric layer, the first via and the first substrate in electrical communication with the substrate; and forming a second via and a second metal wire in the dielectric layer, fir second via and the second metal wire in electrical communication with the substrate, wherein the second via and the second metal wire are laterally separated from the first via and the first metal wire; forming a first probe pad on the first metal wire of the ILD layer to form a first probe pad structure of the split probe pad structure; and forming a second probe pad on the second metal wire of the ILD layer to form a second probe pad structure of the split probe pad structure, the second probe pad laterally separated from the first probe pad, and wherein a portion of the dielectric layer forms a first non-metal region between the first probe pad structure and the second probe pad structure of the split probe pad structure.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific embodiments in which the present teachings may be practiced. These embodiments are described in sufficient detail to enable those skilled in the art to practice the present teachings and it is to be understood that other embodiments may be used and that changes may be made without departing from the scope of the present teachings. The following description is, therefore, merely illustrative.

Embodiments of the present disclosure provide a structure and method for forming a split probe pad structure for a semiconductor structure. Among other things, the split probe pad structure may include a first probe pad structure laterally separated from a second probe pad structure by a non-metal region. The probe pad structures may each include a probe pad electrically connected to the substrate by vias and metal layers in interlayer dielectric layers positioned between the substrate and probe pad. Methods of forming the split probe pad structure may include, among other things, forming an interlayer dielectric (ILD) layer on a substrate, the ILD layer including a dielectric layer including a first via and a first metal wire laterally separated from a second via and second metal wire. Forming the split probe pad structure may also include forming a first probe pad on the first metal wire and forming a second probe pad on the second metal wire such that the probe pads are laterally separated from one another. Embodiments of the present disclosure may mitigate and/or prevent the release and re-settling of metal debris during separation of chips on a substrate.

Figure 3:
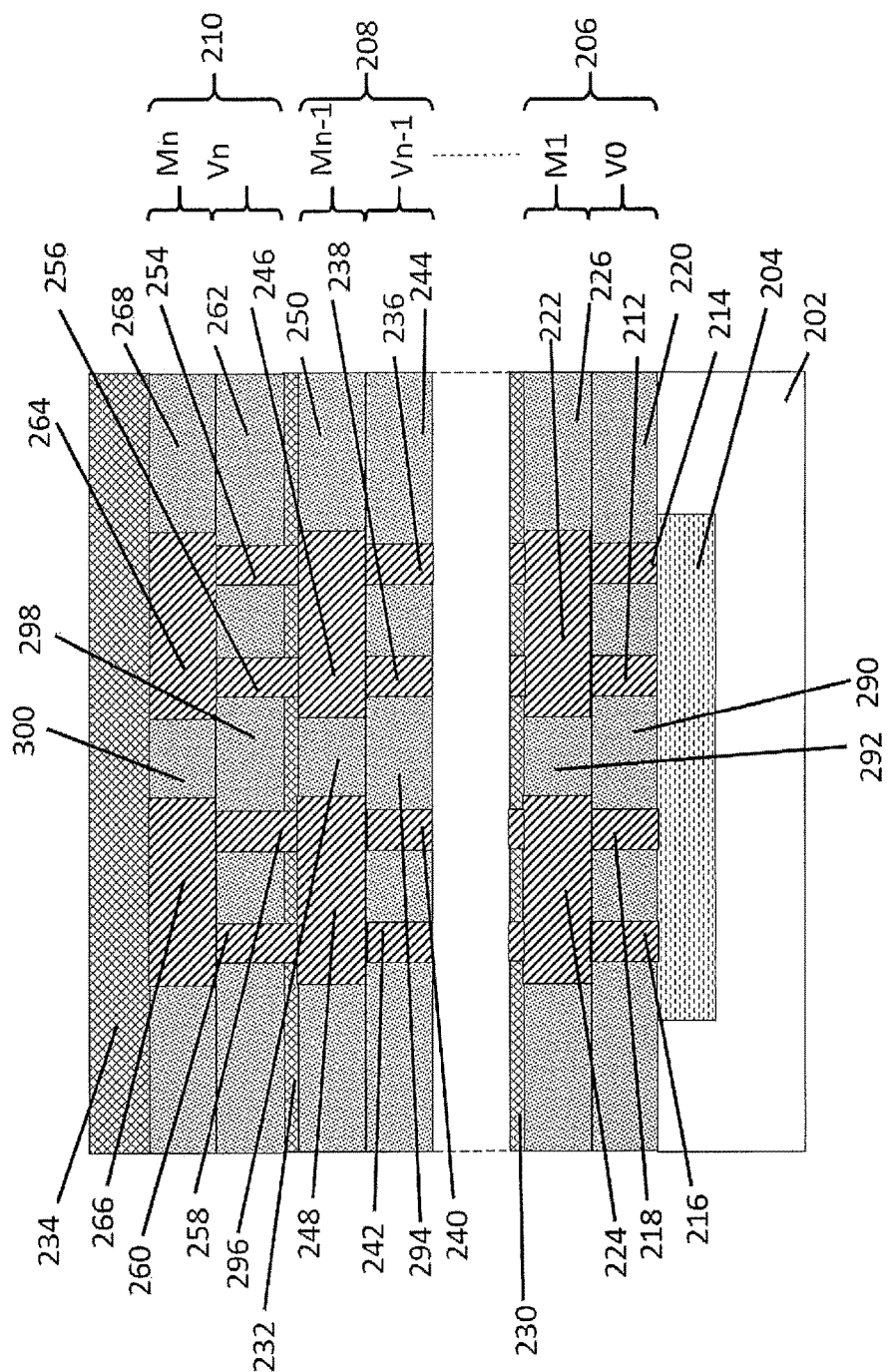
FIG. 3 shows forming interlayer dielectric layers on a substrate for the split probe pad structure, according to embodiments of the disclosure.

Referring to the figures, FIG. 3 shows forming interlayer dielectric (ILD) layers 206, 208, 210 and barrier layers 230, 232, 234 on a substrate 202 including a doped region 204 for electrically connecting a first probe pad 278 (see FIG. 4) and a second probe pad 280 (see FIG. 4) of split probe pad structure 274 (see FIG. 4) to doped region 204 of substrate 202, according to embodiments of the disclosure. For example, the probe pads may be electrically connected to doped region 204 of substrate 202 by the vias and metal wires formed in dielectric layers 220, 226, 244, 250, 262, 268 of ILD layers 206, 208, 210, as described herein. Although three ILD layers are shown in semiconductor structure 276 (see FIG. 4), it is understood that any desirable number of ILD layers for a semiconductor structure may be formed.

Substrate 202 including doped region 204 may be formed using any now known or later developed semiconductor fabrication techniques for forming a doped region in a substrate. Substrate 202 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and $X1+X2+X3+Y1+Y2+Y3+Y4=1$ (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and $A1+A2+B1+B2=1$ (1 being a total mole quantity). Furthermore, a portion or entirety of each layer may be strained. Doped region 204 may include, for example, an n-doped region or a p-doped region of substrate 202.

Turning to first ILD layer 206, the ILD layer may include an initial via layer $V_0$ on substrate 202 and a first metal layer $M_1$ on initial via layer $V_0$. Initial via layer $V_0$ may include, for example, vias 212, 214, 216, 218 in a dielectric layer 220. First metal layer $M_1$ may include, for example, metal wires 222, 224 in a dielectric layer 226. Although four vias and two metal wires are shown, any desirable number of metal wires and vias for split probe pad structure 274 (see FIG. 4) may be formed in an ILD layer.

Dielectric layer 220 may be formed on substrate 202 by any now known or later developed semiconductor manufacturing techniques for forming a dielectric layer. For example, dielectric layer 220 may be formed by deposition on substrate 202. As used herein, the term "depositing" may include any now known or later developed technique appropriate for deposition, including but not limited to, for example: chemical vapor deposition (CVD), low-pressure CVD (LPCVD), plasma-enhanced CVD (PECVD), semi-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation. Dielectric layer 220 may include but is not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (0), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof.

As discussed above, dielectric layer 220 of initial via layer $V_0$ may include, for example, vias 212, 214, 216, 218 formed therein. Vias 212, 214 may be laterally separated from vias 216, 218 such that a portion 290 of dielectric layer 220 remains therebetween. Vias 212, 214, 216, 218 may be formed by any now known or later developed semiconductor manufacturing techniques for forming a via in a dielectric layer. For example, forming vias 212, 214, 216, 218 may include forming openings (i.e., trenches) (not shown) in dielectric layer 220 and filling the openings with electrically conductive material. The openings may be formed, for example, by patterned etching of dielectric layer 220. Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g., silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. Although not shown, liners may be formed in the openings formed in dielectric layer 220 before depositing the conductive material therein. The liners and the conductive material for vias 212, 214, 216, 218 may be formed in the openings, for example, by deposition. The liners may include, for example, titanium nitride (TiN), tantalum nitride (TaN), tantalum (Ta), titanium (Ti), and/or any other now known or later developed liner material. The conductive material may include, for example, tungsten (W) and/or any other now known or later developed materials for a via.

Dielectric layer 226 may be formed on initial via layer $V_0$ by any now known or later developed semiconductor manufacturing techniques for forming a dielectric layer. For example, dielectric layer 226 may be formed similarly to dielectric layer 220, described above. Dielectric layer 226 may include, for example, a material similar to the materials set forth above with respect to dielectric layer 220.

As discussed above, dielectric layer 226 of first metal layer M1 may include metal wires 222, 224 formed therein. Metal wire 222 may be formed on vias 212, 214 and metal wire 224 may be formed on vias 216, 218. As shown in FIG. 3, metal wire 222 may be laterally separated from metal wire 224 such that a portion 292 of dielectric layer 226 remains therebetween. Metal wires 222, 224 may be formed by any now known or later developed semiconductor manufacturing techniques for forming a metal wire in a dielectric layer. For example, forming metal wires 222, 224 may include forming openings (i.e., trenches) (not shown) in dielectric layer 226 to expose surfaces (not shown) of vias 212, 214, 216, 218, and filling the openings with electrically conductive materials. The openings may be formed, for example, by patterned etching of dielectric layer 226. Filling the openings may include, for example, depositing electrically conductive material in the openings. Although not shown, liners may be formed in the openings formed in dielectric layer 226 before depositing the conductive material therein. The liners and electrically conductive material may be formed in the openings, for example, by deposition. The liners may include, for example, titanium nitride (TiN), tantalum nitride (TaN), tantalum (Ta), titanium (Ti), and/or any other now known or later developed liner material. The electrically conductive material may include, for example, copper (Cu), and/or any other now known or later developed electrically conductive material.

As shown in FIG. 3, a first barrier layer 230 may be formed, for example, on first ILD 206. First barrier layer 230 may include, for example, a nitride layer. First barrier layer 230 may be formed, for example, by deposition.

As discussed above, semiconductor structure 276 may include any desirable number of ILD layers for a semiconductor structure. For example, as shown in FIG. 3, another ILD layer 208 may be formed on any number of ILD layers (not shown) and barrier layers (not shown) positioned on first ILD layer 206 and first barrier layer 230 as may be desirable for semiconductor structure 276. Another barrier layer 232 may be formed on ILD layer 208, according to embodiments of the disclosure. Also shown in FIG. 3, an uppermost ILD layer 210 may be formed on barrier layer 232 and an uppermost barrier layer 234 may be formed on uppermost ILD layer 210. ILD layers 208, 210 and barrier layers 232, 234 may be formed, for example, by the same semiconductor manufacturing techniques described above with respect to first ILD 206 and first barrier layer 230.

ILD layer 208 may include a via layer $V_{n-1}$ on a barrier layer (not shown), and a metal layer $M_{n-1}$ on via layer $V_{n-1}$. Via layer $V_{n-1}$ may include, for example, vias 236, 238, 240, 242 in a dielectric layer 244. Vias 236, 238 may be laterally separated from vias 240, 242 such that a portion 294 of dielectric layer 244 remains therebetween. Metal layer $M_{n-1}$ may include, for example, metal wires 246, 248 in a dielectric layer 250. Metal wire 246 may be formed on vias 236, 238 and metal wire 248 may be formed on vias 240, 242. As shown in FIG. 3, metal wire 246 may be laterally separated from metal wire 246 such that a portion 296 of dielectric layer 250 remains therebetween. Although four vias and two metal wires are shown, any desirable number of metal wires and vias for split probe pad structure 274 (see FIG. 4) may be formed in an ILD layer. Barrier layer 232 may be formed, for example, on ILD layer 208.

Uppermost ILD layer 210 may include a via layer $V_n$ on barrier layer 232, and a metal layer $M_n$ on via layer $V_n$. Semiconductor structure 276 may include n number of via layers and n number of metal layers, where n is any number desirable for the semiconductor structure. Via layer $V_n$ may include, for example, vias 254, 256, 258, 260 in a dielectric layer 262. Vias 254, 256 may be laterally separated from vias 258, 260 such that a portion 298 of dielectric layer 262 remains therebetween. Metal layer $M_n$ may include, for example, metal wires 264, 266 in a dielectric layer 268. Metal wire 264 may be formed on vias 254, 256 and metal wire 266 may be formed on vias 258, 260. As shown in FIG. 3, metal wire 264 may be laterally separated from metal wire 266 such that a portion 300 of dielectric layer 268 remains therebetween. Although four vias and two metal wires are shown, any desirable number of metal wires and vias for split probe pad structure 274 (see FIG. 4) may be formed in an ILD layer. Uppermost barrier layer 234 may be formed, for example, on uppermost ILD layer 210.

Figure 4:
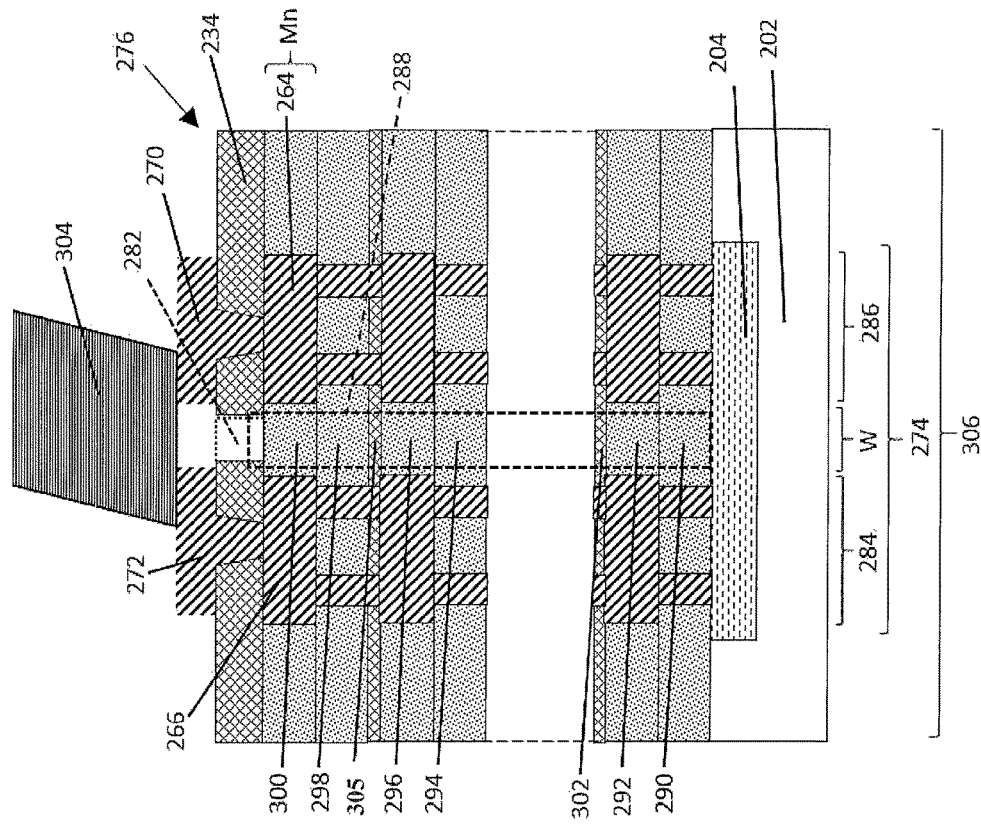
FIG. 4 shows forming a first probe pad and a second probe pad on the structure of FIG. 3 for the split probe pad structure, according to embodiments of the disclosure.

FIG. 4 shows forming a first probe pad 270 and a second probe pad 272 for a first probe pad structure 284 and a second probe pad structure 286, respectively, of split probe pad structure 274, according to embodiments of the disclosure. First probe pad 270 and second probe pad 272 may be electrically connected to doped region 204 of substrate 202 by the vias and metal wires of ILD layers 206, 208, 210. For example, first probe pad 270 may be electrically connected to doped region 204 through the pathway of metal wire 264, vias 254, 256 (see FIG. 3), metal wire 246 (see FIG. 3), vias 236, 238 (see FIG. 3), intermediate vias and metal wires (not shown), metal wire 222 (see FIG. 3), and vias 212, 214 (see FIG. 3). Second probe pad 272 may be electrically connected to doped region 204, for example, through the pathway of metal wire 266, vias 258, 260 (see FIG. 3), metal wire 248 (see FIG. 3), vias 240, 242 (see FIG. 3), intermediate vias and metal wires (not shown), metal wire 224 (see FIG. 3), and vias 216, 218 (see FIG. 3). Although not shown, first probe pad 270 and second probe pad 272 of split probe pad structure 274 may be in electrical communication with a bond pad (not shown) and other devices (not shown) of semiconductor structure 276. For example, the bond pad and devices may be electrically connected to portions of doped region 204 of substrate 202 into the plane of FIG. 4.

As shown in FIG. 4, first probe pad 270 may be formed through uppermost barrier layer 234 to contact metal wire 264 of metal layer $M_n$. First probe pad 270 may be formed by any now known or later developed semiconductor manufacturing process for forming a probe pad. For example, first probe pad 270 may be formed by etching an opening (not shown) in uppermost barrier layer 234 to metal wire 264 of metal layer $M_n$, and depositing probe pad material in the opening and on uppermost barrier layer 234 (e.g., using a mask, not shown). First probe pad 270 may include aluminum and/or any other now know or later developed materials for a probe pad.

As shown in FIG. 4, second probe pad 272 may be formed through uppermost barrier layer 234 to contact metal wire 266 of metal layer $M_n$. Second probe pad 272 may be formed, for example, in the same manner as described above with respect to first probe pad 270. Second probe pad 272 may include aluminum and/or any other now know or later developed materials for a probe pad.

As shown in FIG. 4, first probe pad 270 may be laterally separated from second probe pad 272. As also shown in FIG. 4, a portion 282 of uppermost barrier layer 234 between first probe pad 270 and second probe pad 272 may, for example, be optionally removed by patterned etching of uppermost barrier layer 234.

Figure 1:
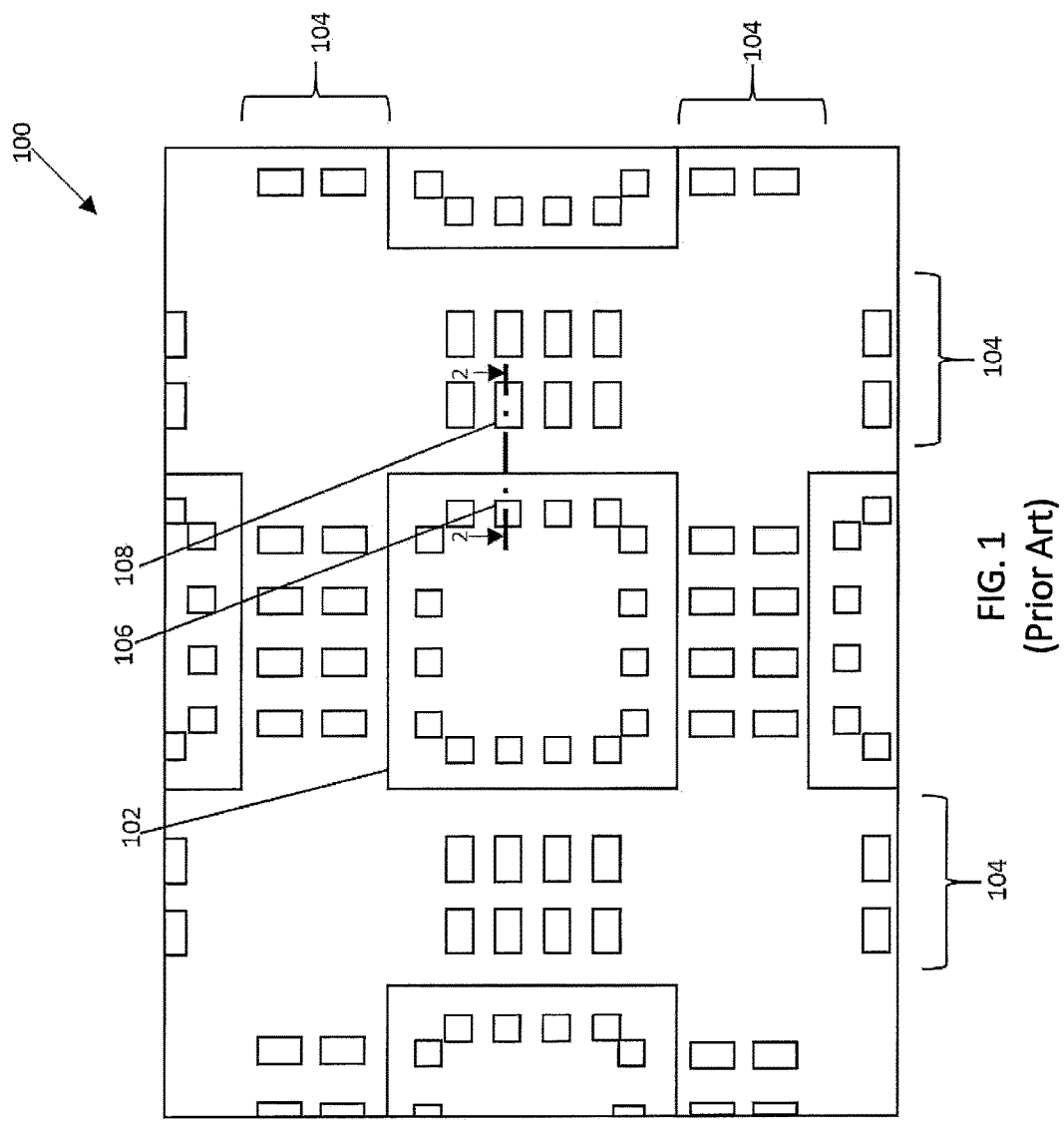
FIG. 1 shows a conventional semiconductor substrate including chips separated by a kerf region.
Figure 2:
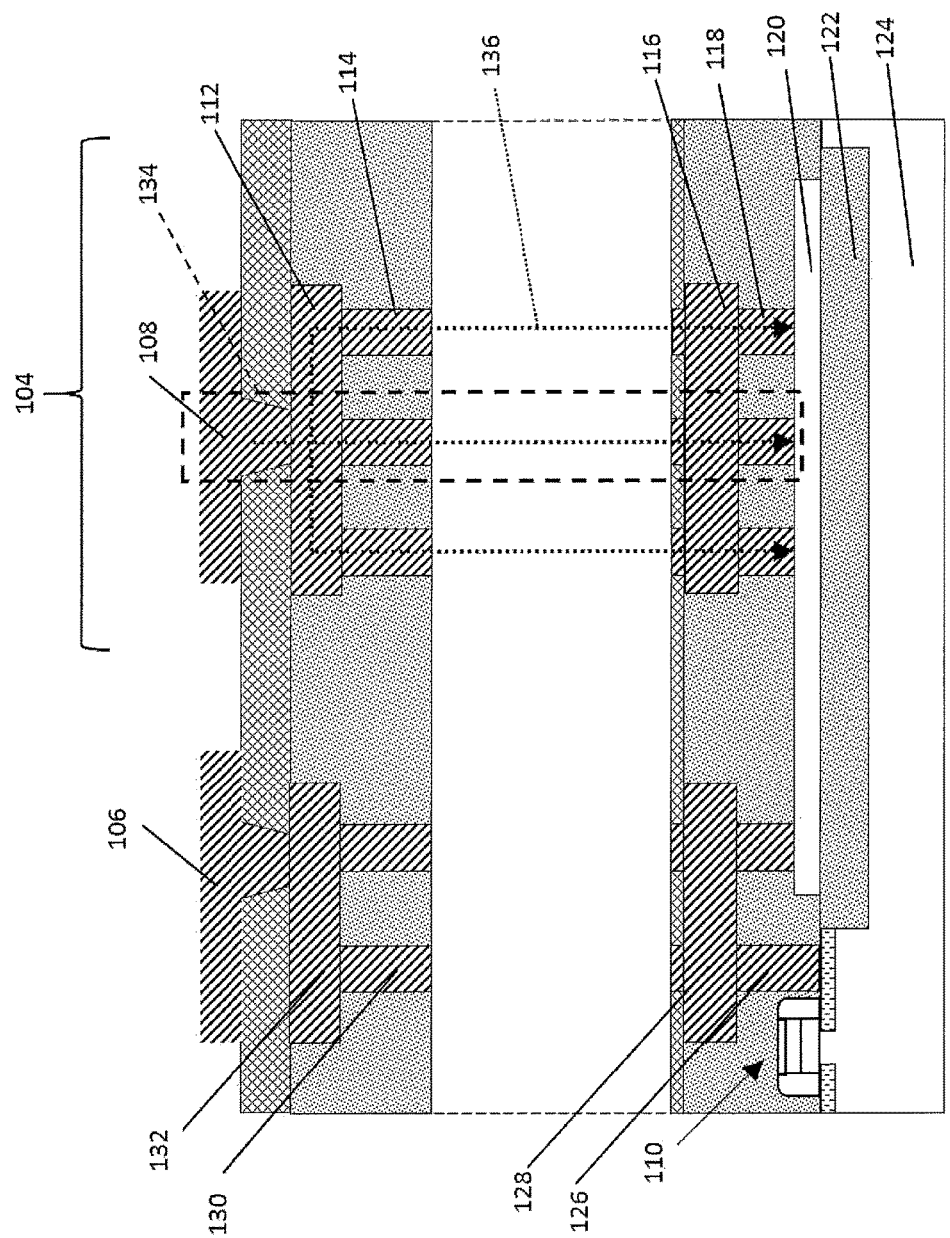
FIG. 2 shows a cross-sectional view of a conventional bond pad and probe pad of the semiconductor substrate of FIG. 1.

Turning to split probe pad structure 274, as shown in FIG. 4, split probe pad structure 274 may include first probe pad structure 284 and second probe pad structure 286. For example, first probe pad structure 284 may include first probe pad 278, metal wires 222, 246, 264 and vias 212, 214, 236, 238, 254, 256. Second probe pad structure 286 may include, for example, second probe pad 280, metal wires 224, 248, 266 and vias 216, 218, 240, 242, 258, 260. As shown in FIG. 4, first probe pad structure 284 may be laterally separated from second probe pad structure 286 by a non-metal region 288 (in phantom). Non-metal region 288 may include, for example, portions 290, 292, 294, 296, 298, 300 of dielectric layers 220, 226, 244, 250, 262, 268 (see FIG. 3) and portions 302, 305 of barrier layers 230, 232 (see FIG. 3). Split probe pad structure 274 may be located, for example, in a kerf region 306 (e.g., see kerf region 104 of FIG. 1) of semiconductor structure 276. In contrast to conventional probe pad structures (e.g., probe pad 108 of FIG. 2), split probe pad structure 274 may allow for cutting of kerf region 306 of semiconductor structure 276 through non-metal region 288, mitigating and/or preventing the metal debris released by cutting through a conventional probe pad structure in a kerf region. Non-metal region 288 may include, for example, a width W of approximately 5 micrometers (μm) to 40 μm. Width W may change based on the technology node and/or the semiconductor dicing tool used. Further, as shown in FIG. 4, split probe pad structure 274 may allow for conventional probe tip 304 to contact both first probe pad 270 and second probe pad 272 to allow for testing of the chips (e.g., see chips 102 of FIG. 1) of semiconductor structure 276 before cutting. Split probe pad structure 274 may also allow for little to no change in the size of kerf region 306.

Figure 5:
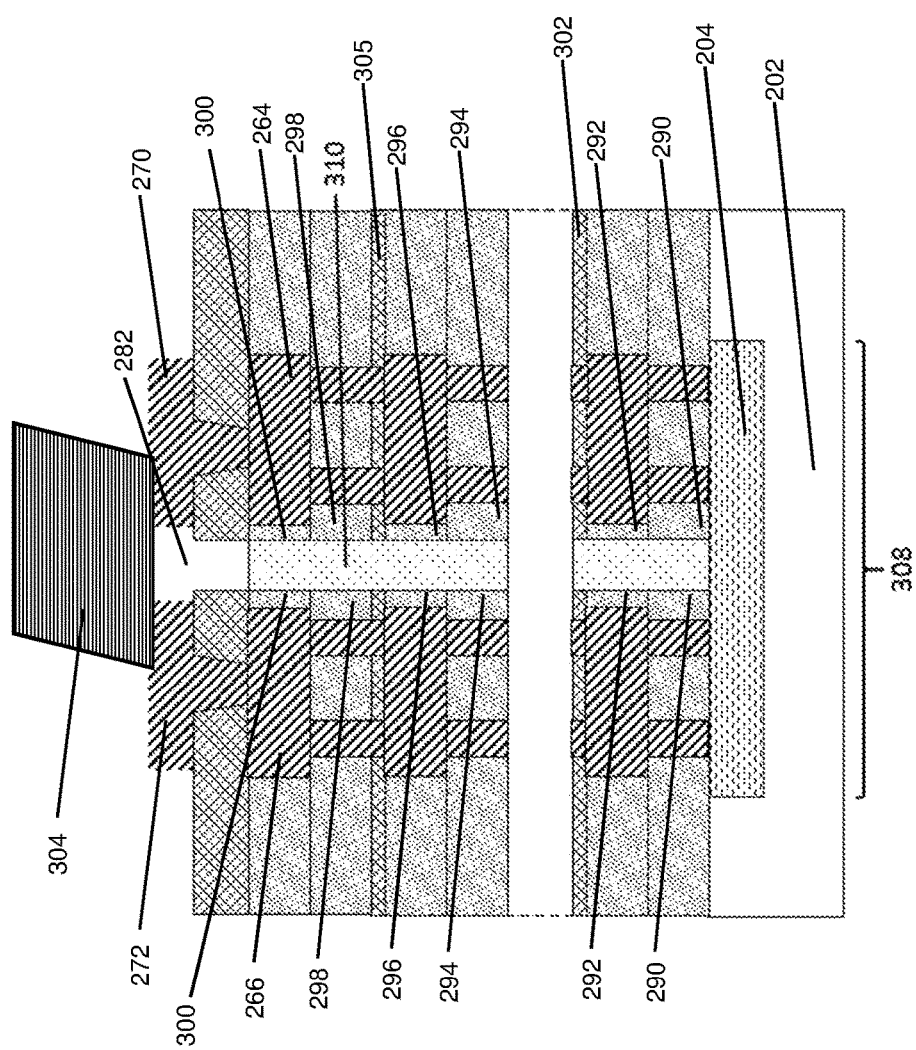
FIG. 5 shows forming a replacement non-metal region for the split probe pad structure, according to embodiments of the disclosure.

FIG. 5 shows a split probe pad structure 308, according to embodiments of the disclosure. Split probe pad structure 308 may optionally include, for example, a replacement non-metal region 310. Replacement non-metal region 310 may be formed, for example, by removing non-metal region 288 between first probe pad structure 284 and second probe pad structure 286 of semiconductor structure 276 of FIG. 4, and forming a replacement non-metal region 310 in the opening (not shown) formed. Non-metal region 288 may be removed, for example, by patterned etching. Replacement non-metal region 310 may be formed, for example, by depositing non-metal material in the opening (not shown). Replacement non-metal region 310 may include, for example, polyimide, air, epoxy, dielectric, insulator film, and/or any other now known or later developed non-metal material desirable for the semiconductor structure.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A semiconductor structure comprising:
   a first probe pad structure over a substrate, the first probe pad structure including a first probe pad in electrical communication with the substrate;
   a second probe pad structure over the substrate, the second probe pad structure including a second probe pad in electrical communication with the substrate, wherein the second probe pad structure is laterally separated from the first probe pad structure;
   a pair of first non-metal regions positioned on the substrate between the first probe pad structure and the second probe pad structure and each having an upper surface in contact with a respective one of the first or second probe pad structure at a lower surface thereof, wherein each of the pair of first non-metal regions includes a plurality of individual dielectric layers therein; and
   a second non-metal region between the pair of first non-metal regions and extending continuously from an upper surface of the substrate to an upper surface of the pair of first non-metal regions, wherein the second non-metal region includes a diceable material not included in the pair of first non-metal regions.

2. The semiconductor structure of claim 1, wherein the first probe pad structure, the second probe pad structure and the non-metal region are positioned in a kerf region of the semiconductor structure.

3. The semiconductor structure of claim 1, wherein each of the pair of first non-metal regions includes dielectric material.

4. The semiconductor structure of claim 1, wherein a width of the second non-metal region is approximately 10 micrometers.

5. The semiconductor structure of claim 1, wherein the first probe pad structure, the second probe pad structure, the pair of first non-metal regions, and the second non-metal region are positioned on a doped region of the substrate.

6. The semiconductor structure of claim 1, wherein the first probe pad structure and the second probe pad structure are laterally separated such that a surface of a probe for electrically testing the semiconductor structure contacts a surface of the first probe pad and a surface of the second probe pad during a testing of the semiconductor structure.

7. The semiconductor structure of claim 1, wherein a width of the second non-metal region defines a width of a channel created during a separation of the semiconductor structure from another semiconductor structure by cutting through the second non-metal region.

8. The semiconductor structure of claim 1, wherein the second non-metal region includes polyimide.

9. A split probe pad structure in a kerf region of a semiconductor structure, the split probe pad structure comprising:
   a first probe pad structure over a doped region of a substrate of the semiconductor structure, the first probe pad structure including a first probe pad in electrical communication with the doped region of the substrate;
   a second probe pad structure over the doped region of the substrate, the second probe pad structure including a second probe pad in electrical communication with the doped region of the substrate, and wherein the second probe pad structure is laterally separated from the first probe pad structure;
   a pair of first dielectric regions positioned on the doped substrate region between the first probe pad structure and the second probe pad structure and each having an upper surface in contact with a respective one of the first or second probe pad structure at a lower surface thereof, wherein each of the pair of first dielectric regions includes a plurality of individual layers therein; and
   a second dielectric region positioned on the doped substrate region between the pair of first dielectric regions extending continuously from an upper surface of the doped substrate region to an upper surface of the pair of first dielectric regions, wherein the second dielectric region includes a diceable material not included in the pair of first dielectric regions.

10. The split probe pad structure of claim 9, wherein a width of the second dielectric region is approximately 10 micrometers.

11. The split probe pad structure of claim 9, wherein a width of the second dielectric region is approximately 5 micrometers to approximately 40 micrometers.

12. The split probe pad structure of claim 9, wherein the first probe pad structure and the second probe pad structure are laterally separated such that a surface of a probe for electrically testing the semiconductor structure contacts a surface of the first probe pad and a surface of the second probe pad during a testing of the semiconductor structure.

13. The split probe pad structure of claim 9, wherein a combined width of the pair of first dielectric regions and the second dielectric region is greater than a width of a channel created from the second dielectric region during a separation of the semiconductor structure from another semiconductor structure by cutting through the second dielectric region.

14. The split probe pad structure of claim 9, wherein the split probe pad structure is configured to be cut only in the second dielectric region during a separation of the semiconductor structure by dicing through the kerf region.

15. A split probe pad structure in a kerf region of a semiconductor structure, the split probe pad structure comprising:
    a substrate;
    a pair of via chains each positioned on the substrate and laterally separated from each other;
    a pair of first dielectric regions each positioned on the substrate adjacent to one of the pair of via chains, each of the pair of first dielectric regions having a lower surface contacting the substrate and an upper surface substantially coplanar with an upper surface of the pair of via chains, wherein each of the pair of first dielectric regions includes a plurality of individual layers therein; and
    a second dielectric region positioned on the substrate directly between the pair of first dielectric regions, the second dielectric region extending continuously from an upper surface of the substrate to an upper surface of the pair of first dielectric regions, wherein the second dielectric region includes a diceable material not included in the pair of first dielectric regions;

a bond layer on an upper surface of the pair of via chains, the pair of first dielectric region, and the second dielectric region;

a first probe pad formed partially within the bond layer and in electrical communication with one of the pair of via chains; and a second probe pad formed partially within the bond layer and in electrical communication with the other of the pair of via chains.

16. The split probe pad structure of claim 15, wherein a width of the second dielectric region is approximately 10 micrometers.

17. The split probe pad structure of claim 15, wherein a width of the second dielectric region is approximately 5 micrometers to approximately 40 micrometers.

18. The split probe pad structure of claim 15, wherein the first probe pad structure and the second probe pad structure are laterally separated such that a surface of a probe for electrically testing the semiconductor structure contacts each the first probe pad and the second probe pad during a testing of the semiconductor structure.

19. The split probe pad structure of claim 15, wherein the second dielectric region defines a width of a channel created from the second dielectric region during a separation of the semiconductor structure from another semiconductor structure by cutting through the second dielectric region.

20. The split probe pad structure of claim 15, wherein the split probe pad structure is configured to be cut only in the second dielectric region during a separation of the semiconductor structure by dicing through the kerf region.

\* \* \* \* \*